United States Patent
Melin

(10) Patent No.: US 12,261,274 B2
(45) Date of Patent: Mar. 25, 2025

(54) NOISE FILTERING IN A BATTERY MODULE

(71) Applicant: Polarium Energy Solutions AB, Kista (SE)

(72) Inventor: Mats Melin, Kista (SE)

(73) Assignee: Polarium Energy Solutions AB, Kista (SE)

(*) Notice: Subject to any disclaimer, the term of this patent is extended or adjusted under 35 U.S.C. 154(b) by 688 days.

(21) Appl. No.: 17/432,302

(22) PCT Filed: Feb. 22, 2019

(86) PCT No.: PCT/EP2019/054461
§ 371 (c)(1),
(2) Date: Aug. 19, 2021

(87) PCT Pub. No.: WO2020/169210
PCT Pub. Date: Aug. 27, 2020

(65) Prior Publication Data
US 2022/0140410 A1  May 5, 2022

(51) Int. Cl.
*H01M 10/46* (2006.01)
*H02M 1/12* (2006.01)
(Continued)

(52) U.S. Cl.
CPC .......... *H01M 10/46* (2013.01); *H02M 1/123* (2021.05); *H02M 1/44* (2013.01); *H02M 3/145* (2013.01)

(58) Field of Classification Search
CPC ........ H01M 10/46; H02M 1/123; H02M 1/44; H02M 3/145
See application file for complete search history.

(56) References Cited

U.S. PATENT DOCUMENTS

2012/0092908 A1    4/2012  Piotr et al.

FOREIGN PATENT DOCUMENTS

CN    103618449 A  *  3/2014
CN    107528466 A     12/2017
(Continued)

OTHER PUBLICATIONS

Machine Translation of WO-2019213673-A1. (Year: 2019).*
(Continued)

*Primary Examiner* — Drew A Dunn
*Assistant Examiner* — Pamela J Jeppson
(74) *Attorney, Agent, or Firm* — MOSER TABOADA

(57) ABSTRACT

A circuit is provided, including first and second input terminals (110, 112) an output terminal (114), a DC-to-DC converter (120), and a trifilar choke (130) including a first inductor (140) connected between the first input terminal (110) and a first input terminal (150) of the converter (120), a second inductor (142) connected between the second input terminal (112) and a second input terminal (152) of the converter (120), and a third inductor (144) connected between the output terminal (114) and an output terminal (154) of the converter (120). The converter (120) is configured to convert a first voltage ($V_1$) received at its first and second input terminals (150, 152) to a second voltage ($V_2$) at its output terminal (154) higher than the first voltage ($V_1$). The first, second and third inductors (140, 142, 144) are wound on a same core, mutually coupled and arranged such that currents common to the first and second inductors (140, 142) and currents common to the second and third inductors (142, 144) are blocked or attenuated. A current-limiting device, battery modules and a method of noise filtering are also provided.

5 Claims, 3 Drawing Sheets

(51) Int. Cl.
*H02M 1/44* (2007.01)
*H02M 3/145* (2006.01)

(56) References Cited

FOREIGN PATENT DOCUMENTS

| EP | 1487092 A1 | 12/2004 | |
|---|---|---|---|
| ES | 2348883 A1 | 12/2010 | |
| JP | H1198716 A | 4/1999 | |
| JP | 2004297551 A | 10/2004 | |
| WO | WO 2017/211418 A1 | 12/2017 | |
| WO | WO-2019213673 A1 * | 11/2019 | ............ H02M 1/007 |

OTHER PUBLICATIONS

International Search Report for Application No. PCT/EP2019/054461 dated Nov. 8, 2019.
Written Opinion of the International Preliminary Examining Authority for Application No. PCT/EP2019/054461 dated Feb. 2, 2021.
International Preliminary Report on Patentability for Application No. PCT/EP2019/054461 dated May 14, 2021.
European Office Action for Application No. 19707355.4-1202 dated Feb. 7, 2023.
European Office Action for Application No. 19707355.4-1202 dated Jun. 19, 2024, 9 pages.

* cited by examiner

NOISE FILTERING IN A BATTERY MODULE

TECHNICAL FIELD

The present disclosure relates to the field of power converters such as used in chargeable battery modules. In particular, the present disclosure relates to reduction of electromagnetic interference caused by a direct current to direct current (DC-to-DC) power converter using a trifilar choke.

BACKGROUND

To convert from one DC voltage to another, DC-to-DC power converters of a switch-mode type relies on a switching regulator in order to efficiently convert electrical power. When operating at high switching frequencies, such power converters may however introduce switching noise. If not attended to, such noise may couple back onto e.g. a mains power line and/or to components connected on the output side of the converter, and lead to unwanted electromagnetic interference (EMI).

Noise on the input and/or output of the converter may appear as common-mode currents. To filter such noise, bifilar chokes are usually provided in a common-mode rejection configuration at the input terminals and/or the output terminals of the converters. The chokes may block or at least attenuate the noise currents common to both of the terminals to which the choke is connected, thereby providing a reduced EMI and an improved electromagnetic compatibility (EMC) of the power converter.

However, if the power converter is to be used to for example charge a battery, the chokes must be able to carry the maximum current for the battery. For larger batteries, such currents may reach hundreds of amperes and the chokes must be dimensioned accordingly in order to not be damaged by the large currents. This may for example lead to an increased cost and/or an increased footprint.

Based on the above, there is therefore a need for an improved way of filtering noise caused by DC-to-DC power converters.

SUMMARY

To at least partly fulfill the above need, the present disclosure seeks to provide a circuit, a current-limiting device, a battery module and a method of noise filtering as defined in the independent claims. Further embodiments are provided in the dependent claims.

According to one aspect of the present disclosure, a circuit is provided. The circuit may include a first input terminal, a second input terminal and an output terminal. The circuit may include a direct current to direct current (DC-to-DC) converter (or power converter). The circuit may further include a trifilar choke which may include a first inductor connected between the first input terminal of the circuit and a first input terminal of the converter, a second inductor connected between the second input terminal of the circuit and a second input terminal of the converter, and a third inductor connected between the output terminal of the circuit and an output terminal of the converter. The converter may be configured to convert a first voltage received at its first input terminal and second input terminal to a second voltage at its output terminal. The second voltage may be higher than the first voltage, i.e. the converter may be e.g. a step-up converter, a boost-converter, or similar.

The first inductor, the second inductor and the third inductor of the trifilar choke may be wound on a same core, mutually coupled and arranged such that currents common to the first inductor and the second inductor and currents common to the second inductor and the third inductor are blocked or attenuated.

Herein, currents common to two inductors is to be interpreted as currents having a same amplitude, phase and direction. For example, if a current passing from a terminal of the device, through an inductor and to a terminal of the converter has a same amplitude and phase as another current also passing from a terminal of the device, through another inductor and to a terminal of the converter, the inductor and the another inductor are said to have currents common to these inductors. The trifilar choke may for example include three windings of wires (or filaments) wound around a same core, and in such a way that common-mode currents flowing in a same direction through e.g. two of the windings creates equal and in-phase magnetic fields which add together. This may result in the choke blocking or attenuating the common-mode currents by presenting a high impedance thereto. Consequently, the trifilar choke may operate as an EMI/EMC filter which eliminates or at least reduces common-mode noise currents to/from the converter.

The circuit according to the present disclosure therefore provides a converter with a trifilar choke acting as a common-mode EMI/EMC filter, wherein currents in the windings of the choke may be balanced and reduce the risk of saturation in the core of the choke. At the same time, only a single (trifilar) choke is needed instead of two separate bifilar chokes, which may provide a reduced overall footprint of the circuit compared with other configurations using two or more bifilar chokes. As will be explained in more detail later herein, such a circuit may also be beneficial when used in a charge-limiting device and/or in a battery module.

In some embodiments, the converter may include an inductance connected between the second input terminal of the converter and a first node. The converter may include a diode connected between the first node and the output terminal of the converter. The converter may include a switching element connected between the first node and the first input terminal of the converter. The converter may include a modulation section configured to alternately operate the switching element between at least an open state and a closed state.

In the closed state, the first node is connected to the first input terminal. In the opened state, the first node is disconnected from the first input terminal.

In some embodiments, the circuit may be configured such that if a power source is connected to the circuit to provide the first voltage at the first input terminal and the second input terminal of the converter, and if a load is connected to the circuit to receive the second voltage at the output terminal and the second input terminal of the converter, a first current will flow from the power source into the second input terminal of the converter and out of the first input terminal of the converter when the switching element is operated in the closed state, and a second current will flow from the output terminal of the converter to the load and into the second input terminal of the converter when the switching element is operated in the open state. Phrased differently, the directions of the currents flowing between the second input terminal of the circuit and the second input terminal of the converter may be the same, and opposite the direction of the current flowing between the first input terminal of the circuit and the first input terminal of the converter, and also opposite the direction of the current flowing between the output terminal of the circuit and the output terminal of the converter.

In some embodiments, the circuit may further include a first capacitor connected between the first input terminal and the second input terminal of the converter. The circuit may include a second capacitor connected between the second input terminal and the output terminal of the converter. The circuit may include a third capacitor connected between the first input terminal and the second input terminal of the circuit. The circuit may include also a fourth capacitor connected between the second input terminal and the output terminal of the circuit. The first, second, third and fourth capacitors may be provided as parts of the trifilar choke, or as parts external to the trifilar choke, or combinations thereof. The capacitors may further improve the filtering capability of the trifilar choke.

According to a second aspect of the present disclosure, a current-limiting device is provided. The device may include a first input terminal and a second input terminal. The first and second input terminals of the device may be connectable to a charger. The device may include a first output terminal and a second output terminal. The first and second output terminals of the device may be connectable to a battery cell arrangement. The device may further include a circuit as described herein with reference to the first aspect of the present disclosure. The output terminal of the circuit may be connected to the first input terminal and the first output terminal of the device. For example, the first input terminal and the first output terminal of the device may be connected, and the output terminal of the circuit may be connected to at least one of the first input terminal and first output terminal of the device, or to a point therebetween. The first input terminal of the circuit may be connected to the second input terminal of the device. The second input terminal of the circuit may be connected to the second output terminal of the device.

As will be described later herein, such a current-limiting device may use the circuit to regulate a charge current to the battery in an efficient way, without the full charge current needing to pass through the circuit. In particular, the placement of the trifilar choke at the converter, instead of e.g. at the output and/or input terminals of the current-limiting device, may allow for the trifilar choke to work as an EMI/EMC filter for the converter and the charge-limiting device, without requiring that the often large charge currents need to be passed through the choke when charging the battery cell arrangement.

In some embodiments, a switching device may be connected between the first input terminal and the second input terminal of the circuit. The switching device may e.g. be a transistor, and be operated such that it is open (blocking) while the battery is charged, or at least as long as a voltage across the battery is below a certain threshold value. When the battery is no longer to be charged, or at least when the voltage across the battery exceeds the certain threshold value, the switching device may be operated such that it is closed (conducting) such that the input terminals of the circuit are shorted, efficiently disabling the circuit including the converter.

In some embodiments, the circuit may be used such that the device is configured to limit a charge current to the battery cell arrangement when a charge voltage is applied by the charger at the first input terminal and the second input terminal. As will be described later herein, the circuit may for example provide an output current based on its output voltage and conversion efficiency, which in turn may depend on its input voltage. The input voltage of the circuit may be a difference between the applied charge voltage to the charge-limiting device and the actual voltage across the battery cell arrangement (i.e. the output voltage of the circuit).

According to a third aspect of the present disclosure, a battery module is provided. The battery module may include a battery cell arrangement including a first terminal and a second terminal. The module may further include a current-limiting device as described herein with reference to the second aspect. The first output terminal of the device may be connected to the first terminal of the battery cell arrangement, and the second output terminal of the device may be connected to the second terminal of the battery cell arrangement.

The battery module as described herein with reference to the third aspect may for example provide a battery module with an efficient charging and with an EMI/EMC filter in form of a trifilar choke as described above. As also described above, the placement of the choke at the converter, and not at e.g. the output and/or charging terminals of the battery module may reduce the potential current which must pass through the choke, thereby reducing the required dimensions and rating of the choke.

In some embodiments, the battery module may include a further switching device connected between the second terminal of the battery cell arrangement and the second output terminal of the circuit. The further switching device may for example be operated such that it is open when a charger is connected to the battery module for charging the battery cell arrangement, and such that it is closed if a load is connected to the battery module for discharging the battery cell arrangement.

According to a fourth aspect of the present disclosure, a battery module is provided. The module may include a battery cell arrangement. The battery cell arrangement may include a first terminal and a second terminal. The module may include a first charging terminal and a second charging terminal. The first charging terminal may be connected to the first terminal of the battery cell arrangement. The module may include a direct current to direct current (DC-to-DC) converter. The module may also include a trifilar choke. The trifilar choke may include a first inductor connected between the second charging terminal and a first input terminal of the converter, a second inductor connected between the second terminal of the battery cell arrangement and a second input terminal of the converter, and a third inductor connected between the first terminal of the battery cell arrangement and an output terminal of the converter. The converter may be configured to convert a first voltage received at its first input terminal and second input terminal to a second voltage at its output terminal. The second voltage may be higher than the first voltage. The first inductor, the second inductor and the third inductor of the trifilar choke may be wound on a same core, be mutually coupled and arranged such that currents common to the first inductor and the second inductor and currents common to the second inductor and the third inductor are blocked or attenuated.

As described earlier above, and as will be described further below, the configuration and placement of the converter and trifilar choke provides a battery module with efficient limiting of the charge current to the battery cell arrangement by the converter, and wherein the trifilar choke provides EMI/EMC filtering for the battery module without the trifilar choke needing to receive all of the charge current for the battery cell arrangement. In addition, in further contrast to conventional solutions making use of one or more bifilar chokes placed at the charging terminals of the battery module, the use of a single, trifilar choke may allow for a reduced footprint and also a reduced cost of production.

In the embodiments described herein, the switching element of the converter, the switching device of the current-limiting device and/or the further switching device of the battery module(s) may e.g. be of a metal oxide semiconductor field effect transistor (MOSFET), insulated-gate bipolar transistor (IGBT) or bipolar junction transistor (BJT) type. It is envisaged also that the various switching devices and/or switching elements may be based on a mechanical switch or electromechanical device, such as a relay switch. The various switching devices and switching elements may be of a same type, or of different types.

According to a fifth aspect, a method of noise filtering when regulating a charge current in a battery module using a direct current to direct current converter is provided. The method may include providing a trifilar choke including a first inductor, a second inductor and a third inductor all wound on a same core and mutually coupled. The method may include connecting a first input/charging terminal of the battery module to a first terminal of the battery cell arrangement. The method may include arranging the first inductor between a first input terminal of the converter and a second input/charging terminal of the battery module. The method may include arranging the second inductor between a second input terminal of the converter and a second terminal of the battery cell arrangement. The method may include arranging the third inductor between an output terminal of the converter and the first terminal of the battery cell arrangement, and the method may also include providing a charging voltage across the first input/charging terminal and the second input/charging terminal of the battery module. In the method, the first inductor, the second inductor and the third inductor may be further arranged such that currents common to the first inductor and the second inductor, and currents common to the second inductor and the third inductor, are blocked or attenuated.

In some embodiments, the method may further include providing a first capacitor between the ends of the first inductor and the second inductor connected to the converter; providing a second capacitor between the ends of the second inductor and the third inductor connected to the converter; providing a third capacitor between the ends of the first inductor and the second inductor connected to the second input terminal of the module and to the second terminal of the battery cell arrangement, respectively; and providing a fourth capacitor between the ends of the second inductor and the third inductor connected to the second terminal of the battery cell arrangement and to the first terminal of the battery cell arrangement, respectively.

The present disclosure relates to all possible combinations of features recited in the claims. Further, any embodiment described with reference to a circuit according to the first aspect may be combinable with any of the embodiments described with reference to the current-limiting device described with reference to the second aspect, the battery module described with reference to the third aspect, the battery module described with reference to the fourth aspect, and/or the method described with reference to the fifth aspect, and vice versa.

Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which.

Figure 1A:
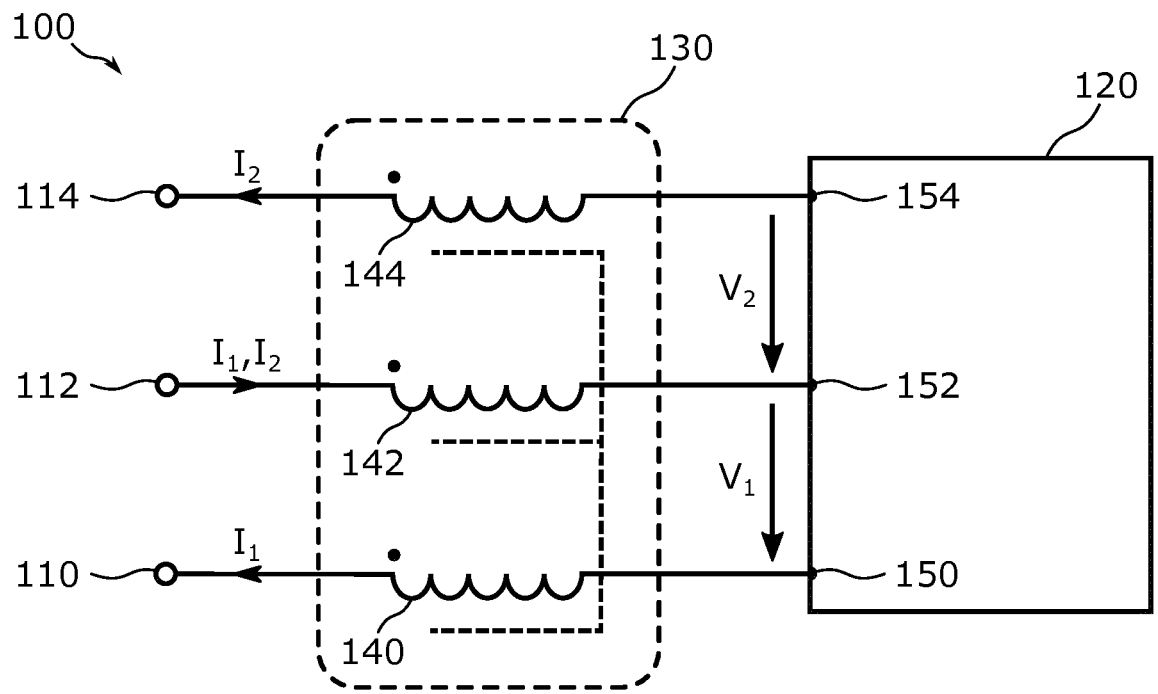
FIG. 1a illustrates schematically an embodiment of a circuit according to the present disclosure.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may not necessarily be drawn to scale and may e.g. be exaggerated for illustrative purposes and, thus, are provided to illustrate the general structures of the embodiments.

DETAILED DESCRIPTION

Exemplifying embodiments will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person.

Figure 1B:
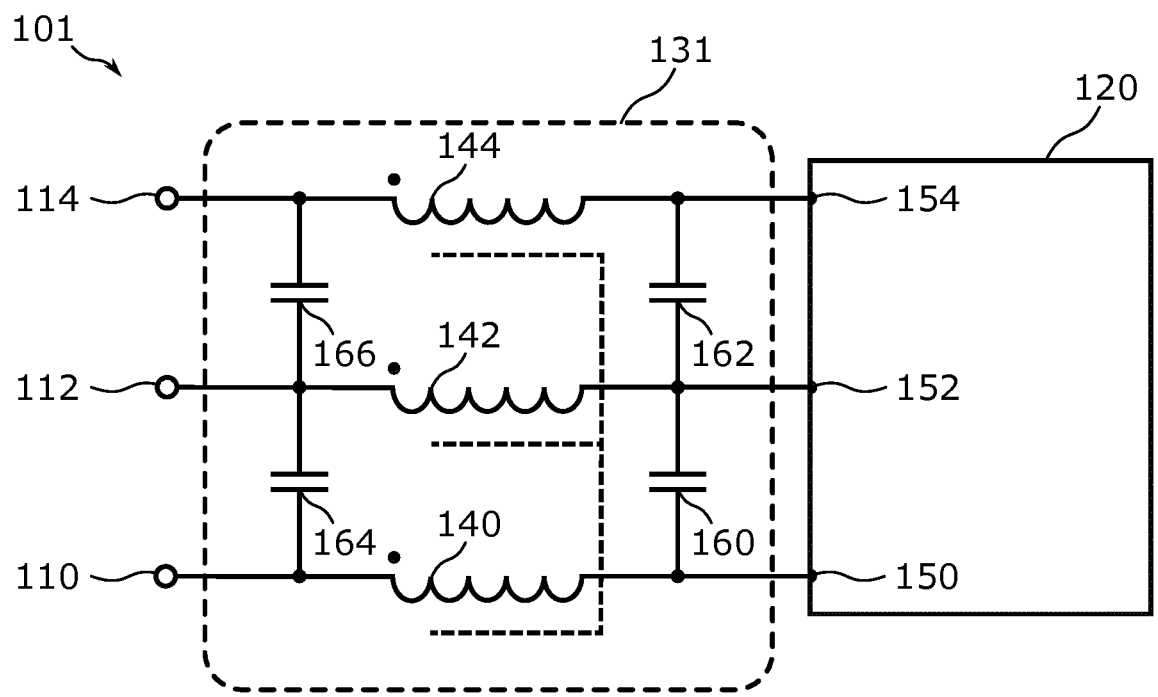
FIG. 1b illustrates schematically an embodiment of a circuit according to the present disclosure.

With reference to FIGS. 1a and 1b, embodiments of a circuit according to the present disclosure will now be described in more detail.

FIG. 1a illustrates schematically an embodiment of a circuit 100. The circuit 100 has a first input terminal 110, a second input terminal 112 and an output terminal 114. The circuit 100 also includes a DC-to-DC converter 120 which has a first input terminal 150, a second input terminal 152 and an output terminal 154. The circuit 100 further includes a trifilar choke 130 which includes a first inductor 140, a second inductor 142, and a third inductor 144. The first inductor 140, the second inductor 142 and the third inductor 144 are wound on a same core (as illustrated in FIG. 1a by the dashed lines below each inductor) and mutually coupled (such as indicated in FIG. 1a by the dots above each inductor). The first inductor 140 is connected between the first input terminal 110 of the circuit 100 and the first input terminal 150 of the converter 120. The second inductor 142 is connected between the second input terminal 112 of the circuit 100 and the second input terminal 152 of the converter 120. The third inductor 144 is connected between the output terminal 114 of the circuit 100 and the output terminal 154 of the converter 120.

The converter 120 may be e.g. a boost convert, a step-up converter, or similar, and takes an input voltage $V_1$ on the input terminals 150 and 152 and outputs an output voltage $V_2$ on the output terminal 154 (e.g. between the output terminal 154 and the second input terminal 152). Although referred to as "second input terminals", as will be described below, the terminals 112 and 152 function as combined input/output terminals in that both a power supply (from which the converter 120 receives power) and a load (to which the converter 120 provides power) may be connected to the terminal 112 and to the terminal 152 via the second inductor 142.

During operation of the circuit 100, the power supply (not shown) may be connected to the first input terminal 150 and the second input terminal 152 of the converter 120, and a load (also not shown) may be connected to the output terminal 114 and the second input/output terminal 112 of the circuit 100. An input voltage (e.g. a DC input voltage) provided by the power supply across the input terminals 110 and 112 of the circuit 100 may be provided as a voltage $V_1$ across the terminals 150 and 152 of the converter 120, and the converter 120 may transform the voltage $V_1$ into a higher voltage $V_2$ at the output terminal 154 of the converter (e.g. between the output terminal 154 and the second input/output terminal 152 of the converter 120). The voltage $V_2$ may be provided as an output voltage to the load across the output terminal 114 and the second input/output terminal 112 of the circuit 100.

In particular, an input current $I_1$ may pass from the power supply to the converter 120 via the second inductor 142, and back to the power supply via the first inductor 140. Likewise, an output current $I_2$ may pass from the converter 120 to the load via the third inductor 144, and back to the converter via the second inductor 142. During normal operation, current in the second inductor 142 will move in a direction different from current in the first inductor 140 and the third inductor 144, and the inductors will present a low impedance to such normal currents. However, due to the inductors 140, 142, 144 being mutually coupled and arranged as indicated by the dots in FIG. 1a, noise currents which travels in a same direction in both the first inductor 140 and the second inductor 142, and/or in a same direction in both the second inductor 142 and the third inductor 144, will generate equal and in-phase magnetic fields which add together, and the inductors 140, 142, 144 will present a high impedance to such "common-mode" noise currents. By the configuration of the converter 120 as described herein, current will always flow in the second inductor 142, while current will alternately flow in the first inductor 140 and in the third inductor 144 depending on whether the switching element in the converter 120 is in the opened or closed state.

As a result, the configuration of the converter 120 with the shared input/output terminal 152 allows the trifilar choke 130 to function as a filter for common-mode noise currents. The filter reduces the effects of EMI due to e.g. switching within the converter 120, and improves the EMC of the circuit 100. In addition, the use of a single choke, instead of e.g. separate bifilar chokes arranged both on the input terminals and the output terminals of the converter, allows for a reduced footprint and cost of circuit including the converter and filter.

FIG. 1b illustrates schematically another embodiment of a circuit 101 according to the present disclosure. In the circuit 101, a first capacitor 160 is connected between the first input terminal 150 and the second input/output terminal 152 of the converter 120; a second capacitor 162 is connected between the second input/output terminal 152 and the output terminal 154 of the converter 120; a third capacitor 164 is connected between the first input terminal 110 and the second input/output terminal 112 of the circuit 101; and a fourth capacitor 166 is connected between the second input/output terminal 112 and the output terminal 114 of the circuit 101. In the circuit 101 as illustrated in FIG. 1b, the capacitors 160-166 form part of the trifilar choke 131. It is envisaged also that the capacitors 160-166, if included, may instead be located outside of the choke 131. In such an embodiment of the circuit 101, the trifilar choke 131 may be identical to the trifilar choke 130 described with reference to the circuit 100 illustrated in FIG. 1a. The various capacitors 160-166 may for example help to prevent also differential-mode noise currents to reach/emerge from the circuit 101, and/or for example help to reduce voltage ripple at the output of the converter 120. It is envisaged also that in addition to the trifilar choke 130, the filter may include other components not shown in the Figures.

Figure 1C:
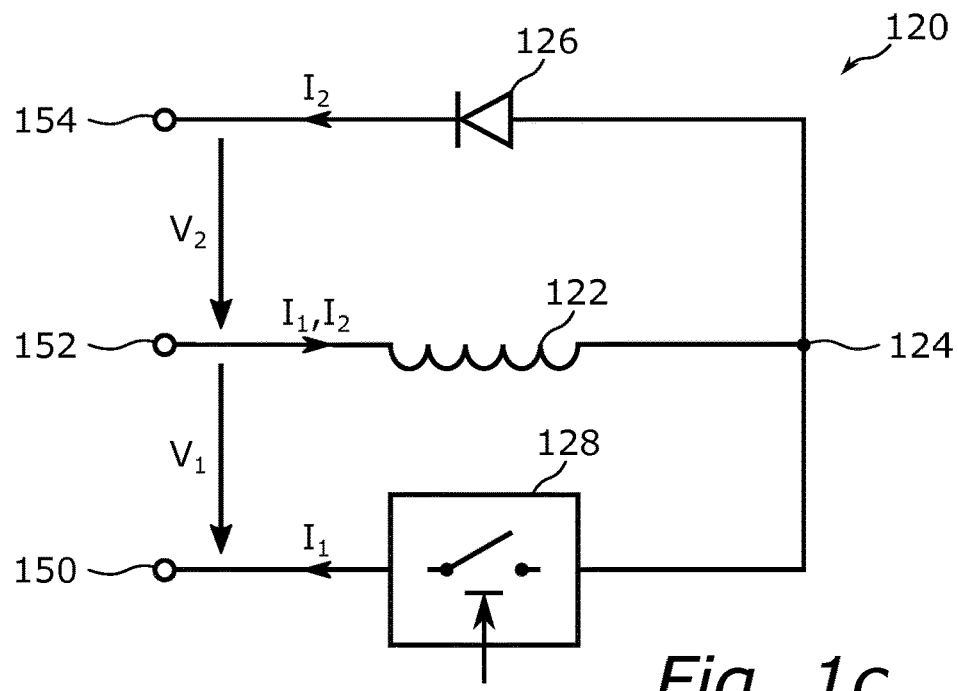
FIG. 1c illustrates schematically an embodiment of a converter according to the present disclosure.

With reference to FIG. 1c, the DC-to-DC converter 120 as used in some embodiments of the circuits 100,101 will now be described in more detail.

FIG. 1c illustrates schematically a DC-to-DC converter 120. The converter 120 has a first input terminal 150, a second input/output terminal 152 and an output terminal 154. The converter 120 includes an inductance, i.e. a storage inductance, 122 which is connected between the second input/output terminal 152 and a first node 124. The converter 120 includes a diode 126 which is connected between the first node 124 and the output terminal 154 and oriented such that current is kept from passing from the output terminal 154, through the diode 126 and towards the first node 124. The converter 120 also includes a switching element 128 which is connected between the first node 124 and the first input terminal 150. Also, the converter 120 includes a modulation section (not shown) which is connected to the switching element 128, and which may alternately operate the switching element 128 between at least an open state (in which the switching element 128 disconnects the first node 124 from the first input terminal 150) and a closed state (in which the switching element 128 connects the first node 124 to the first input terminal 150).

When the switching element 128 is operated in the opened state, a voltage $V_1$ provided across the first input terminal 150 and the second input/output terminal 152 will force a current $I_1$ to pass into the second input/output terminal 152, through the inductor 122 and out via the first input terminal 150. It is assumed that, at this stage, no or very little current flows through the diode 126 due to the higher impedance of such an alternative current path. The polarity across the inductor 122 may be assumed to be such that the polarity on the side of the inductor 122 closest to the second input/output terminal 152 is positive. When the current $I_1$ flows through the inductor 122, the inductor 122 may store some energy by generating a magnetic field.

In a next stage, the modulation section operates the switching element 128 to the open state, such that current may no longer flow through the switching element 128. The current will instead flow through the diode 126 and out at the output terminal 154. Due to the increased impedance of the current path through the diode, compared with the current path through the closed switching element 128, the current $I_2$ flowing through the diode 126 will be smaller than the current $I_1$. However, as the inductor 122 will attempt to oppose any change in current flowing through it, the magnetic field previously created will be destroyed in order to keep the current flowing. As a consequence, the polarity across the inductor 122 will change, resulting in a higher voltage at the first node 124 due to both the input voltage across the input terminals 152 and 150 and the voltage across the inductor 122 now being connected in series. A voltage $V_2$ output across e.g. the output terminal 154 and the second input/output terminal 152 (which now serves as an output) will thus be higher than the input voltage $V_1$. If the switching of the switching element 128 between the open and closed state is repeated quick enough, the inductor 122 will not discharge fully between each cycle and the output voltage $V_2$ experienced by the load connected across the output terminal 154 and the second input/output terminal 152 will always be higher than the input voltage $V_1$. The ratio between the input voltage $V_1$ and the output voltage $V_2$ may be controlled by e.g. the duty cycle of the switching.

In this and other embodiments, it is envisaged also to include e.g. one or more capacitors connected between the output terminal 154 and the second input/output terminal 152. Such one or more capacitors may be charged by the current $I_2$ when the switching element 128 is in the opened state, and the one or more capacitors may then be able to provide energy to the load also during the next stage when the switching element 128 is in the closed state. This may provide e.g. a smoother voltage output to the load.

It is envisaged that the skilled person would know how to properly select the sizes of the various inductors and capacitances, and how to modulate the switching element 128 accordingly to obtain a desired ratio between input voltage and output voltage when using the converter 120.

Figure 2:
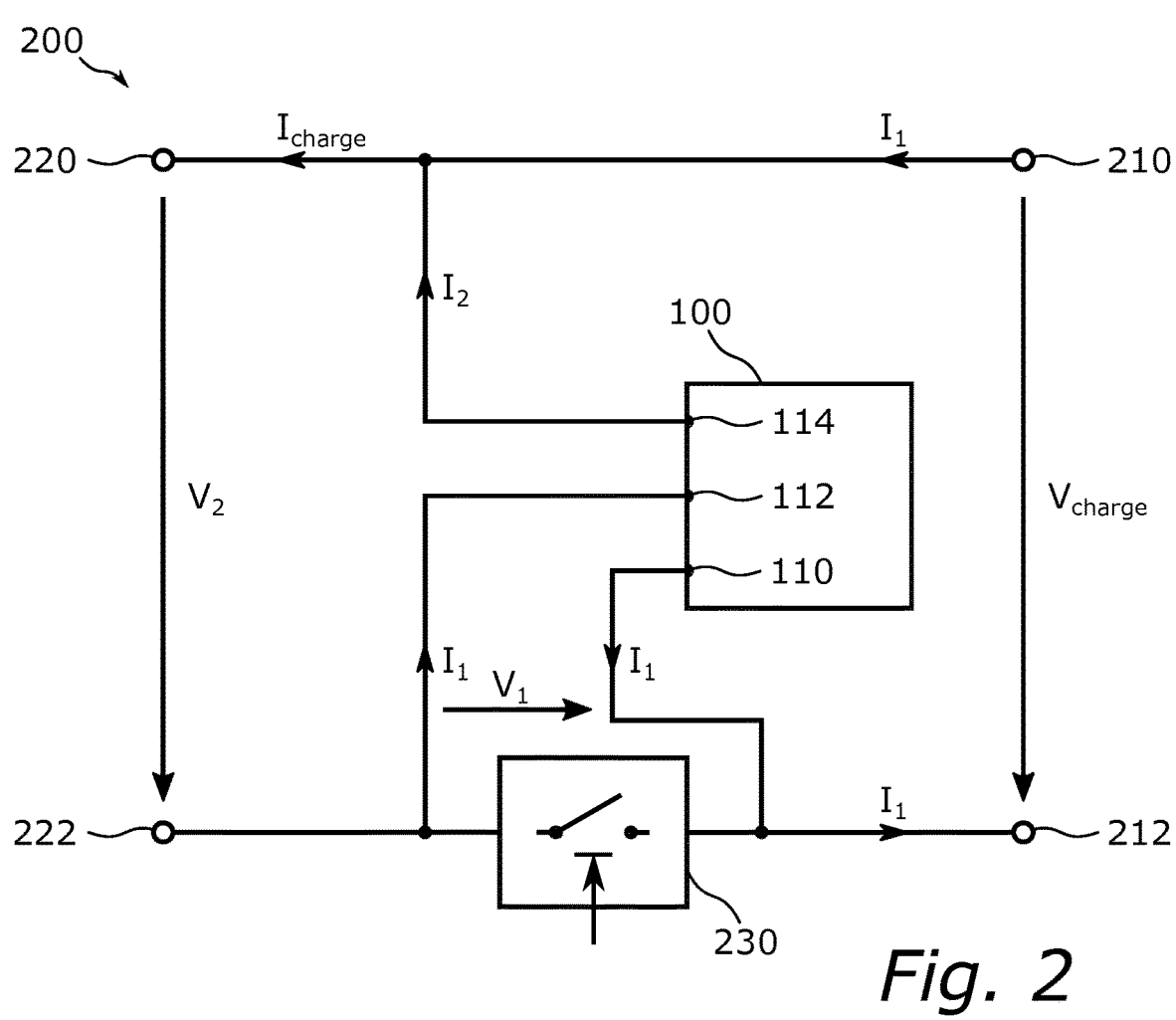
FIG. 2 illustrates schematically an embodiment of a current-limiting device according to the present disclosure.

With reference to FIG. 2, an embodiment of a current-limiting device according to the present disclosure will now be described in more detail.

FIG. 2 illustrates schematically an embodiment of a current-limiting device 200. The device 200 includes a first input terminal 210 and a second input terminal 212. The first and second input terminals 210, 212 may serve as charging terminals and be connected e.g. to a charger (not shown). The device 200 includes a first output terminal 220 and a second output terminal 222. The first and second output terminals 220, 222 may be connected e.g. to a battery cell arrangement (not shown) which is to be charged by the charger. The device 200 also includes a circuit 100. The circuit 100 may be the circuit as described earlier herein, for example the circuit 100 as described with reference to FIG. 1a or the circuit 101 as described with reference to FIG. 1b.

The output terminal 114 of the circuit 100 is connected to the first input terminal 210 of the device 200. The first input terminal 110 of the circuit 100 is connected to the second input terminal 212 of the device 200. The second input terminal 112 of the circuit 100 is connected to the second output terminal 222 of the device 200.

If the input terminals 210, 212 of the device 200 are connected to a charger (not shown), and if the output terminals 220, 222 of the device 200 are connected to a battery cell arrangement (not shown) which is to be charged by the charger, the operation of the device 200 may be illustrated by the following example:

Assume that the charger provides a charging voltage $V_{charge}$ across the input terminals 210, 212. When the battery cell arrangement is fully charged, the voltage $V_2$ across the terminals 220, 222 will also be $V_{charge}$ or at least close to $V_{charge}$. However, as long as the battery cell arrangement is not fully charged, the voltage $V_2$ will be less than $V_{charge}$, and the voltage $V_1$ across the input terminals of the circuit 100 will be finite and equal to $V_1 = V_{charge} - V_2$. As long as the voltage across the input terminals of the converter in the circuit 100 is kept above a certain threshold, the converter may be adapted to maintain a constant power level of $P_{input}$ at its input terminals (and i.e. at the input terminals 110 and 112 of the circuit 100), and the current $I_1$ flowing into the circuit 100 will be $I_1 = P_{input}/V_1$. With a conversion efficiency of X % (where X=[0-100]), the power level $P_{output}$ at the output of the converter (and i.e. at the output terminal 114 and e.g. the second input/output terminal 112) of the circuit 100 will be $P_{output} = (X/100) \cdot P_{input}$. The current $I_2$ flowing out of the output terminal 114 of the circuit will be $P_{output}/V_2$, and it may be seen in FIG. 2 that the charge current $I_{charge}$ to the battery will equal $I_{charge} = I_1 + I_2 = P_{input}/V_1 + P_{output}/V_2 = P_{input} \cdot (1/(V_{charge} - V_2) (X/100)/V_2)$.

If, for example, $V_{charge}$=60 V, $P_{input}$=60 W, X=50, and $V_2$=30 V (i.e., the battery cell arrangement is not close to being fully charged), the circuit 100 will regulate the charge current to the battery such that $I_{charge}$=4 A, with a corresponding power $P_{battery} = V_2 \cdot I_{charge}$=120 W provided to the battery. Meanwhile, the input power $P_{charge}$ provided by the charger to the device 200 is given by $P_{charge} = V_{charge} \cdot I_1 = (V_{charge}/(V_{charge} - V_2)) \cdot P_{input}$=150 W. Comparing the input power $P_{charge}$ provided by the charger to the power $P_{battery}$ provided to the battery, one finds that the total charging efficiency in the above example is 80%.

If, instead, $V_2$=45 V (i.e. the battery cell arrangement is close to being fully charged), one finds that $I_{charge}$=12.67 A, $P_{battery}$=570 W and $P_{charge}$=600 W, leading to a total charging efficiency of 95%. In summary, the device 200 allows to efficiently regulate the charge current to the battery, and provides a high total charging efficiency even if the efficiency of the converter itself (in the above example 50%) is low. Increasing the efficiency of the converter would further improve the total charging efficiency.

Once the battery cell arrangement gets close to being fully charged, the voltage $V_1$ across the input terminals 110, 112 of the circuit 100 is reduced, and may eventually fall below a threshold value under which the converter can no longer maintain the constant input power $P_{input}$ and/or its conversion efficiency. However, when the battery cell arrangement is close to being fully charged, it may be assumed that the battery cells within the battery cell arrangement is less sensitive to high charge currents, and the need for the converter is then reduced or eliminated. By e.g. detecting the voltage across the battery (i.e. the voltage $V_2$), the charging level of the battery cell arrangement may be determined, and the switching device 230 may be operated such that it is closed (and thereby shorting the inputs to the circuit 100) once the battery is determined to be close to fully charged or fully charged. Likewise, if it is determined that the battery is not close to being fully charged, the switching device 230 may be operated such that it is opened, allowing the circuit 100 to regulate the charge current to the battery cell arrangement as described above.

Figure 3:
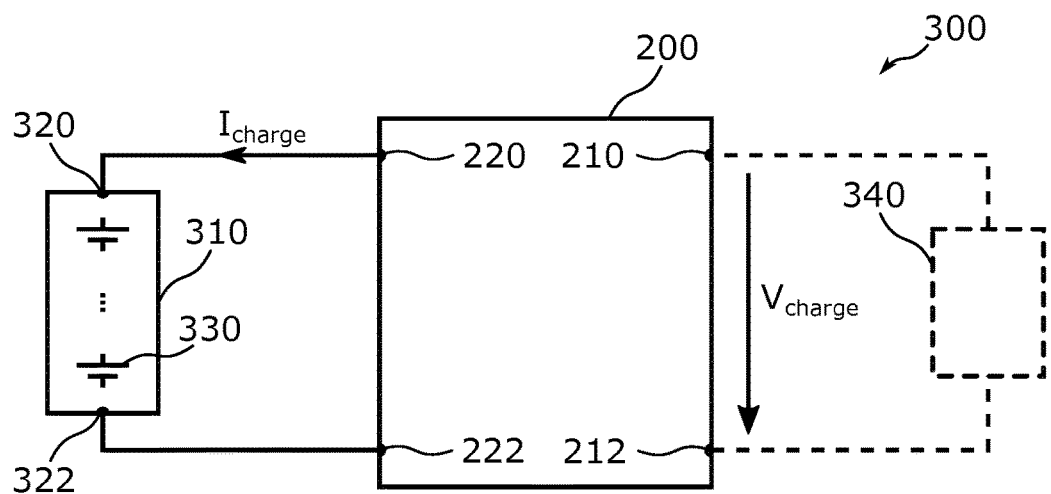
FIG. 3 illustrates schematically an embodiment of a battery module according to the present disclosure.

With reference to FIG. 3, an embodiment of a battery module according to the present disclosure will now be described in more detail.

FIG. 3 illustrates schematically a battery module 300, including a current-limiting device 200 as described above with reference to FIG. 2, and a battery cell arrangement 310. The battery cell arrangement 310 has a first terminal 320 which is connected to the first output terminal 220 of the device 200, and a second terminal 322 which is connected to the second output terminal 222 of the device 200. The battery module 300 may further be connected to a charger 340, using the first input terminal 210 and the second input terminal 220 of the device 200. The charger 340 may provide the voltage $V_{charge}$ across the input terminals 220, 222 of the device. The battery cell arrangement 310 includes one or more battery cells 330, which may for example include lithium or lithium-ions. The one or more battery cells 330 may for example be Lithium cells, but it is envisaged also that other battery technologies may be used for the battery cells 330 of the battery cell arrangement 310.

Figure 4:
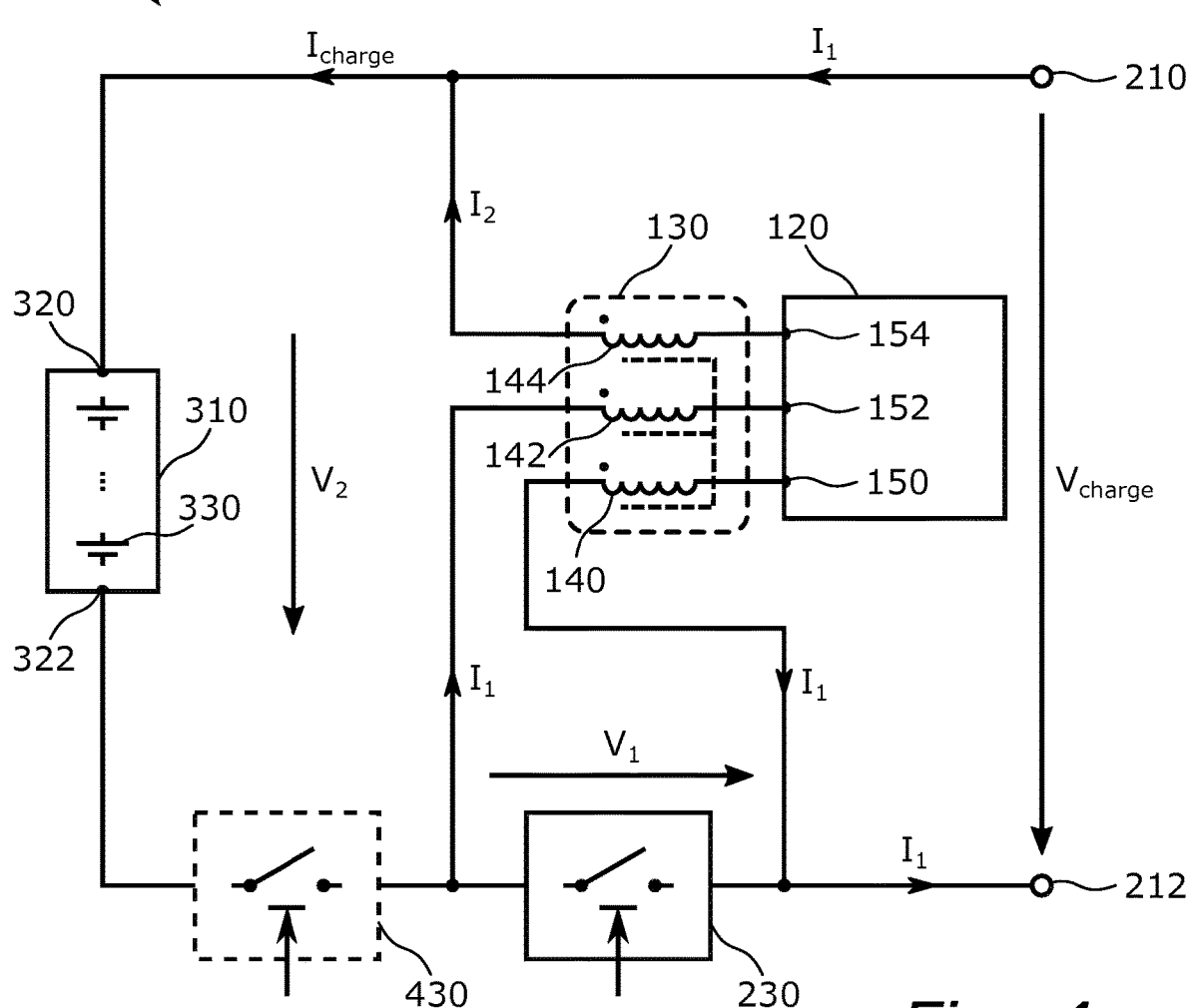
FIG. 4 illustrates schematically an embodiment of a battery module according to the present disclosure.

With reference to FIG. 4, an embodiment of a battery module according to the present disclosure will now be described in more detail.

FIG. 4 illustrates schematically a battery module 400. The module 400 includes a first input/charging terminal 210 and a second input/charging terminal 212, and the input/charging terminals 210, 212 may for example be connected to a charger in order to provide a charging voltage $V_{charge}$ across the terminals 210, 212.

The module 400 includes a battery cell arrangement 310, wherein a first terminal 320 of the arrangement 310 is connected to the first input terminal 210 of the module 400, and wherein the battery cell arrangement 310 includes one or more battery cells 330 as discussed above in relation to the module 300 described with reference to FIG. 3.

The module 400 includes a DC-to-DC converter 120, which as described earlier herein may for example be a boost-converter, a step-up converter, or similar, such as the converter 120 described with reference to FIG. 1c. The converter 120 has a first input terminal 150, a second input terminal 152 and an output terminal 154. As described earlier herein, the second input terminal 152 may also serve as an output terminal, making the terminal 152 a combined input/output terminal. The converter 120 is configured to transform an input voltage provided at the input terminals 150 and 152 to an output voltage at the output terminal 154, where the output voltage is higher than the input voltage.

In particular, an EMC/EMI filter in form of a trifilar choke 130 is arranged such that it connects the converter 120 to the rest of the module 400. As e.g. discussed in relation to the embodiments of the circuits 100, 101 described with reference to FIGS. 1a and 1c, the trifilar choke 130 includes a first inductor 140, a second inductor 142 and a third inductor 144, all wound on a same core (as indicated by the dashed lines under each inductor) and mutually coupled (as indicated by the dots at each inductor) such that a magnetic field induced by a current passing through one inductor effects a current passing through one or more of the other inductors, and vice versa. As further indicated by the location of the dots above each inductor, the trifilar choke 130 is arranged in a common-mode rejection fashion, such that equally large currents passing through e.g. the first inductor 140 and the second inductor 142, and/or e.g. in the second inductor 142 and the third inductor 144, in a same direction will induce equal and in-phase magnetic fields which will add up, and result in a high impedance of the trifilar choke 130 for such currents. Phrased differently, the trifilar choke 130 will allow currents to flow in opposite directions in e.g. the first inductor 140 and the second inductor 142, and/or in the second inductor 142 and the third inductor 144, and the trifilar choke 130 will block corresponding currents which flows in a same direction, leading to a common-mode rejection filtering which reduces EMI otherwise caused by the converter 120 and which thereby improves the EMC of the module 400.

The converter 120 is connected to the first terminal 320 of the battery cell arrangement 310 via the third inductor 144. A switching device 230 is provided between the ends of the inductors 140 and 142 not connected to a respective input terminal 150 and 152 of the converter, and the respective ends of the inductors 140 and 142 are also connected to the second input terminal 212 of the module 400 and the second terminal 322 of the battery 310, respectively (as illustrated in FIG. 4).

It should be noted that the battery module 400 as described with reference to FIG. 4 is the same as e.g. the battery module 300 described with reference to FIG. 3, but where the various components/constituents are shown directly instead of being implicitly included in objects such as "the circuit 100/101" and/or "the charge-limiting device 200".

The battery module 400 may also be provided with a further switching device 430, which may be operated such that it is open (blocking) while the battery cell arrangement 310 is being charged (e.g. when a charger is connected to the input terminals 210, 212 of the module 400), and e.g. such that it is closed (conducting) when the battery cell arrangement 310 is not being charged and e.g. instead connected to a load through which the battery cell arrangement 310 is to be discharged. It is envisaged, also, that the module 400 may be simultaneously connected to both a charger and a load (e.g. such that the charger and the load are connected in parallel). The further switching device 430 may then for example be used to control whether the battery cell arrangement 310 is to be charged or discharged. The further switching device 430 may be optional.

The present disclosure also provides a method of noise filtering when regulating a charge current in a battery module using a DC-to-DC converter. The method includes the steps taken to provide the connection of the trifilar coil at the converter as described e.g. with reference to FIGS. 1a, 1b, 2, 3 and 4, and includes also providing the charging voltage at the input/charging terminals of the battery module.

Although not illustrated in any of Figures, it is envisaged that in the embodiments of the various circuits, current-limiting devices, battery modules and methods as disclosed herein, additional circuitry may be provided for controlling the various switching elements, switching devices and modulation sections as needed.

While referring to the embodiments shown in FIGS. 1a, 1b, 1c, 2, 3 and 4, further details and alternatives about the DC-DC converter 120, its possible connections in e.g. the battery module 300, 400 and its functionality may be of the type described in the International patent application PCT/EP2016/063144 by the same applicant. The same applies also to the charging functionality of the charge-limiting device 200 and the battery modules 300, 400, where further details and alternatives are also to be found in the above referred to International patent application. Accordingly, the content of International patent application PCT/EP2016/063144 is herein incorporated in its entirety.

However, the present disclosure improves on previous teachings by introducing the trifilar choke. In particular, the placement of the trifilar choke directly at the terminals of the converter results in currents always flowing only in one direction in each inductor during normal operation of the battery module. This introduces balanced currents in the inductors of the choke during normal operation, and provides common-mode rejection filtering in order to reduce unwanted EMI from e.g. the switching within the converter. This enhances the EMC of the battery module. In addition, the placement of the trifilar choke directly at the converter terminals, and not e.g. at the input terminals of the battery module, avoids having to run/pass the full charge current (e.g. the current provided by the charger) to the battery through all or some parts of the choke. This reduces the rating requirements of the choke, prevents a saturation of the core of the choke and allows the choke to be made more cost and area effective.

The person skilled in the art realizes that the present disclosure is by no means limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A battery module, comprising:
a battery cell arrangement including a first terminal of the battery cell arrangement and a second terminal of the battery cell arrangement,
a first charging terminal and a second charging terminal connectable to a charger; and
a current-limiting device, including:
  a first input terminal of the current-limiting device connected to the first charging terminal, and a second input terminal of the current-limiting device connected to the second charging terminal;
  a first output terminal of the current-limiting device connected to the first terminal of the battery cell arrangement and a second output terminal of the current-limiting device connected to the second terminal of the battery cell arrangement,
  wherein the first input terminal of the current-limiting device is connected to the first output terminal of the current-limiting device;
  a circuit including:
    a first terminal of the circuit, a second terminal of the circuit, and a third terminal of the circuit;
    a direct current-to-direct current converter; and
    a trifilar choke including a first inductor connected between the first terminal of the circuit and a first terminal of the converter, a second inductor connected between the second terminal of the circuit and a second terminal of the converter, and a third inductor connected between the third terminal of the circuit and a third terminal of the converter,
  wherein the third terminal of the circuit is connected to the first input terminal of the current-limiting device and the first output terminal of the current-limiting device, wherein the first terminal of the circuit is connected to the second input terminal of the current-limiting device, and wherein the second terminal of the circuit is connected to the second output terminal of the current-limiting device,
  wherein the converter is configured to convert a first voltage ($V_1$) between the first terminal of the converter and the second terminal of the converter to a second voltage ($V_2$) at the third terminal of the converter, the second voltage ($V_2$) being higher than the first voltage ($V_1$), and
  wherein the first inductor, the second inductor and the third inductor of the trifilar choke are wound on a same core, mutually coupled and arranged such that currents common to the first inductor and the second inductor and currents common to the second inductor and the third inductor are blocked or attenuated,
  wherein the converter includes:
    an inductance connected between the second terminal of the converter and a first node;
    a diode connected between the first node and the third terminal of the converter;
    a switching element connected between the first node and the first terminal of the converter; and
    a modulation section configured to alternately operate the switching element between at least an open state and a closed state.

2. The battery module of claim 1, further comprising a first capacitor connected between the first terminal of the converter and the second terminal of the converter, a second capacitor connected between the second terminal of the converter and the third terminal of the converter, a third capacitor connected between the first terminal of the circuit and the second input terminal of the circuit, and a fourth capacitor connected between the second terminal of the circuit and the third terminal of the circuit.

3. The battery module of claim 1, further comprising a switching device connected between the first terminal of the circuit and the second terminal of the circuit.

4. The battery module of claim 1 wherein, using the circuit, the current-limiting device is configured to limit a charge current ($I_{charge}$) to the battery cell arrangement when a charge voltage ($V_{charge}$) is applied by the charger at the first terminal and the second terminal of the current-limiting device.

5. The battery module of claim 1, further comprising a further switching device connected between the second terminal of the battery cell arrangement and the second terminal of the circuit.

* * * * *